(12) United States Patent
Liao et al.

(10) Patent No.: US 9,245,633 B2
(45) Date of Patent: Jan. 26, 2016

(54) STORAGE DEVICE, ELECTRONIC DEVICE, AND METHOD FOR PROGRAMMING MEMORY

(71) Applicant: HTC Corporation, Taoyuan (TW)

(72) Inventors: Yi-Hsin Liao, Hsinchu County (TW); Fu-Jen Yeh, Hsinchu County (TW); Chia-Yin Lu, Taoyuan (TW); Shih-Hung Chu, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 14/340,558

(22) Filed: Jul. 24, 2014

(65) Prior Publication Data

US 2015/0206589 A1   Jul. 23, 2015

(51) Int. Cl.
G11C 16/10 (2006.01)
G06F 11/14 (2006.01)

(52) U.S. Cl.
CPC ............ G11C 16/10 (2013.01); G06F 11/1456 (2013.01); G11C 16/105 (2013.01)

(58) Field of Classification Search
CPC .............. G11C 16/105; G06F 12/0246; G06F 11/1456
USPC .............. 365/185.12, 103, 162; 711/103, 162
See application file for complete search history.

(56) References Cited

U.S. PATENT DOCUMENTS

| 8,090,918 | B2 | 1/2012 | Fang et al. |
| 8,190,812 | B2 | 5/2012 | Yano et al. |
| 2002/0048193 | A1* | 4/2002 | Tanikawa et al. ......... 365/185.33 |
| 2008/0117682 | A1* | 5/2008 | Byeon ..................... 365/185.18 |
| 2010/0274951 | A1* | 10/2010 | Fang et al. .................... 711/103 |
| 2013/0173848 | A1 | 7/2013 | Lassa et al. |
| 2013/0311710 | A1 | 11/2013 | Yang |
| 2014/0281174 | A1* | 9/2014 | Lee .............................. 711/103 |

OTHER PUBLICATIONS

"Office Action of German Counterpart Application", issued on Dec. 4, 2014, p. 1-p. 8.

* cited by examiner

Primary Examiner — Hoai V Ho
Assistant Examiner — Jay Radke
(74) Attorney, Agent, or Firm — Jianq Chyun IP Office

(57) ABSTRACT

A storage device, an electronic device, and a corresponding method for programming a memory are provided. The memory includes a plurality of cells. Each of the cells stores a plurality of bits. The bits of the memory are arranged into a plurality of pages of the memory. The method includes the following steps: receiving a host command for programming data into a first page of the memory; and performing 2Plane programming to program the data into the first page and backups the data into a second page of the memory when the first page does not consist of the most significant bits (MSBs) of the cells. The first page and the second page are located in different planes of the memory.

11 Claims, 2 Drawing Sheets

STORAGE DEVICE, ELECTRONIC DEVICE, AND METHOD FOR PROGRAMMING MEMORY

CROSS-REFERENCE TO RELATED APPLICATION

This application claims the priority benefits of U.S. provisional application Ser. No. 61/929,986, filed on Jan. 22, 2014. The entirety of the above-mentioned patent applications is hereby incorporated by reference herein and made a part of this specification.

BACKGROUND OF THE INVENTION

1. Field of the Invention

The present invention relates to a memory. More particularly, the present invention relates to a storage device, an electronic device, and a method for programming a memory.

2. Description of the Related Art

Modern mobile electronic devices, such as smart phones, use embedded multimedia cards (eMMCs) as storage devices for mass data storage. The eMMC is based on NAND (negated AND) flash technology. Users often power on or shut down smart phones during operation. Sometimes this kind of behavior causes sudden power-off for the eMMC storage of a smart phone. Due to characteristics of NAND flash memories, some data in the eMMC storage may be corrupted under this situation.

There are three types of NAND flash memories, namely, single-level cell (SLC), multi-level cell (MLC) and triple-level cell (TLC). An SLC flash memory stores 1 bit per cell. An MLC flash memory stores 2 bits per cell. A TLC flash memory stores 3 bits per cell. From this architectural difference, MLC and TLC have higher data capacity and cheaper price but shorter lifespan compared to SLC.

The pages of an MLC flash memory may be classified into two groups, namely, group A and group B. The pages in group A consist of the least significant bits (LSBs) of the cells, while the pages in group B consist of the most significant bits (MSBs) of the cells. The pages in groups A and B are associated in pairs. In other words, each pair consists of a page in group A and a page in group B. The following table 1 is an example of page pairs of an MLC flash memory. Each row in table 1 is a page pair. For example, page 9 in group A and page 12 in group B are associated as a pair. Page 9 consists of the LSBs of some cells of the MLC flash memory, while page 12 consists of the MSBs of the same cells of the MLC flash memory.

TABLE 1

| Group A | Group B |
| --- | --- |
| 0 | 2 |
| 1 | 4 |
| 3 | 6 |
| 4 | 8 |
| 7 | 10 |
| 9 | 12 |
| 11 | 14 |
| 13 | 16 |
| ... | ... |

The pages in a pair share common word lines. Due to characteristics of NAND flash memories, for each pair, the page in group A has to be programmed before the page in group B. When sudden power failure occurs during programming the page in group A, page corruption appears only in the page in group A. However, when sudden power failure occurs during programming the page in group B, page corruption can appear not only in the page in group B but also in the associated page in group A that was already programmed. Sometimes the corruption in the page in group A is unexpected for the operating system (OS) of the smart phone, which may lead to booting deadlock due to page corruption. For the sake of reliability, the page in group A should be backed up before programming the page in group B.

This backup operation can produce additional busy time of the flash memory; therefore it can affect the performance of the flash memory. Conventionally it is very difficult to keep data reliability as well as maintain better performance of eMMC storage.

The discussions above can be extended to MLC flash memories. The pages of a TLC flash memory may be classified into three groups, namely, group A, group B and group C. The pages in group A consist of the LSBs of the cells. The pages in group B consist of the middle bits of the cells. The pages in group C consist of the MSBs of the cells. The pages in groups A, B and C are associated in sets. In other words, each set consists of a page in group A, a page in group B and a page in group C. When sudden power failure occurs during programming a page in group A, page corruption appears only in the page in group A. When sudden power failure occurs during programming the associated page in group B, page corruption can appear in the page in group A and the page in group B. When sudden power failure occurs during programming the associated page in group C, page corruption can appear in the page in group A, the page in group B and the page in group C. Therefore, data backup for the pages in group A and group B is necessary.

SUMMARY OF THE INVENTION

Accordingly, the present invention is directed to a storage device, an electronic device, and a method for programming a memory to provide a solution for both of data reliability and performance of a memory storage system.

According to an embodiment of the present invention, a storage device is provided. The storage device includes a memory and a controller. The memory includes a plurality of cells. Each of the cells stores a plurality of bits. The bits of the memory are arranged into a plurality of pages of the memory. The controller is coupled to the memory. The controller receives a host command for programming data into a first page of the memory. When the first page does not consist of the MSBs of the cells, the controller performs 2Plane programming to program the data into the first page and backups the data into a second page of the memory. The first page and the second page are located in different planes of the memory.

According to another embodiment of the present invention, an electronic device is provided. The electronic device includes the aforementioned storage device and a processor. The processor is coupled to the storage device. The processor provides the host command to the storage device.

According to another embodiment of the present invention, a method for programming the aforementioned memory is provided. The method includes the following steps: receiving a host command for programming data into a first page of the memory; and performing 2Plane programming to program the data into the first page and backups the data into a second page of the memory when the first page does not consist of the MSBs of the cells. The first page and the second page are located in different planes of the memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
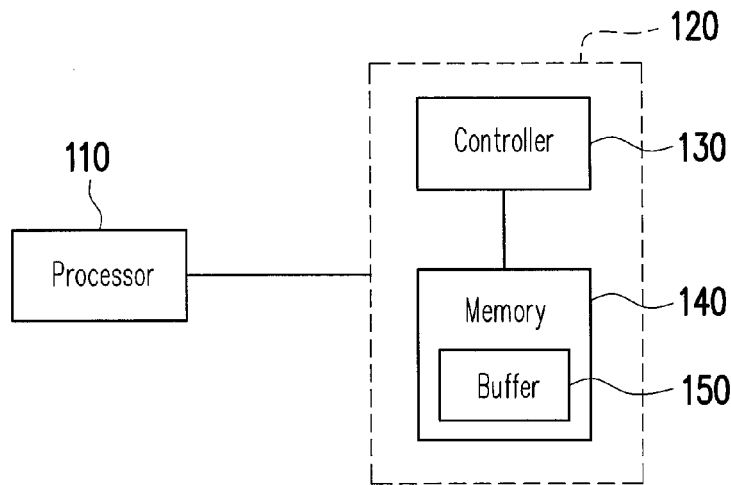
FIG. 1 is a schematic diagram showing an electronic device according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram showing an electronic device 100 according to an embodiment of the present invention. The electronic device 100 may be a smart phone, a personal digital assistant (PDA), a tablet computer, a notebook computer, a personal computer (PC), or any other device that is capable of processing electronic data. The electronic device 100 includes a processor 110 and a storage device 120. The processor 110 is coupled to the storage device 120. The storage device 120 includes a controller 130 and a memory 140. The controller 130 is coupled to the memory 140. The memory 140 may be a NAND flash memory or any other memory that has the same programming/erasing characteristics as those of a NAND flash memory.

The memory 140 includes a plurality of cells. Each cell stores a plurality of bits. The bits of the memory 140 are arranged into a plurality of pages of the memory 140. The pages of the memory 140 are arranged into a plurality of blocks of the memory 140. In addition, the memory 140 includes a buffer 150. The buffer 150 may be implemented with a dynamic random-access memory (DRAM) or a static random-access memory (SRAM).

The memory 140 is capable of 1Plane programming and 2Plane programming. 1Plane programming means programming one page of a plane in response to one command from the controller 130, while 2Plane programming means programming two pages simultaneously of respective planes in response to one command from the controller 130.

Figure 2:
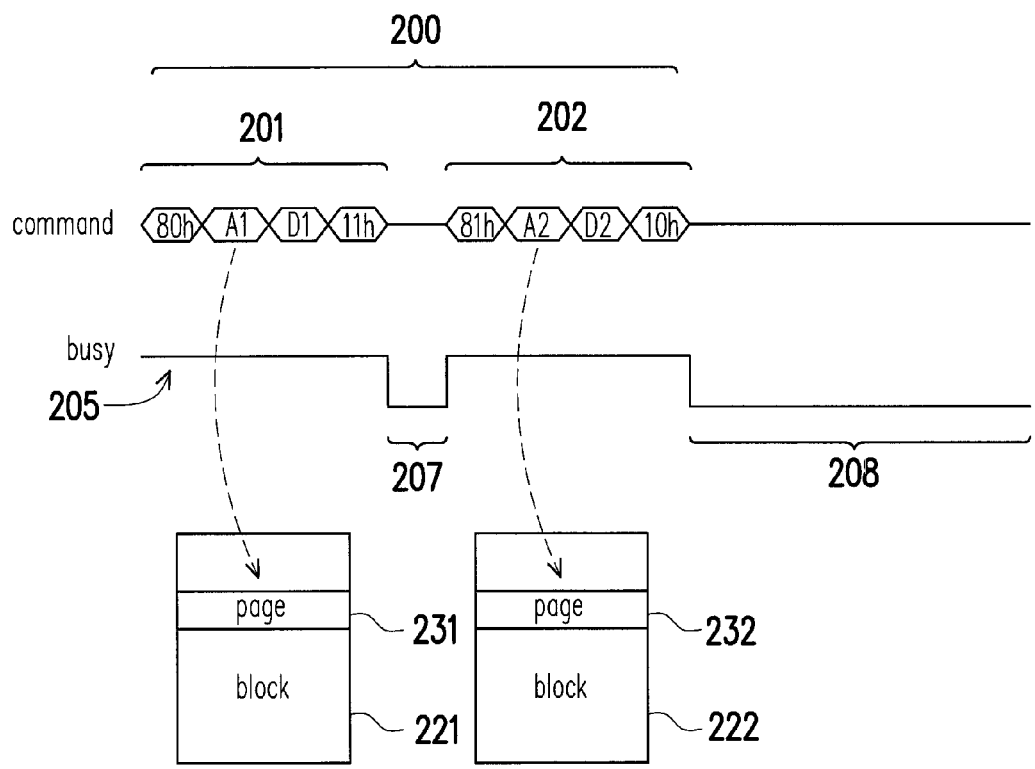
FIG. 2 is a schematic diagram showing a 2Plane programming according to an embodiment of the present invention.

FIG. 2 is a schematic diagram showing a 2Plane programming according to an embodiment of the present invention. In this embodiment, the processor 110 provides a host command to the controller 130 for programming data into the memory 140. The controller 130 interprets the host command into a 2Plane command 200 which includes two controller sub-commands 201 and 202 for 2Plane programming, and the controller 130 sends the controller sub-commands 201 and 202 to the memory 140. The first controller sub-command 201 includes a hexadecimal code 80$h$, an address A1, a batch of data D1, and a hexadecimal code 11$h$. The address A1 specifies the page 231 of the block 221 of a first plane of the memory 140. The data D1 is to be programmed into the page 231. The second controller sub-command 202 includes a hexadecimal code 81$h$, an address A2, a batch of data D2, and a hexadecimal code 10$h$. The address A2 specifies the page 232 of the block 222 of a second plane of the memory 140. The data D2 is to be programmed into the page 232. Although the pages 231 and 232 belong to different blocks, the pages 231 and 232 may have the same index number in the blocks 221 and 222. The data D1 may be the same as the data D2 or different from the data D2.

The memory 140 reports a busy bit 205 to the controller 130. When the busy bit 205 is logically high, it means the memory 140 is idle and ready to receive commands from the controller 130. When the busy bit 205 is logically low, it means the memory 140 is busy executing a command from the controller 130. The memory 140 stores the first controller sub-command 201 into the buffer 150 without executing the first controller sub-command 201 when the memory 140 receives the first controller sub-command 201 from the controller 130. The busy time 207 is the busy time for storing the first controller sub-command 201. The memory 140 executes both of the first controller sub-command 201 and the second controller sub-command 202 when the memory 140 receives the second controller sub-command 202 from the controller 130. The busy time 208 is the busy time for executing both of the controller sub-commands 201 and 202.

In this embodiment, the memory 140 identifies the controller sub-commands 201 and 202 according to their hexadecimal codes (10$h$, 11$h$, 80$h$ and 81$h$). A controller command for 1Plane programming is similar to the controller sub-command 201 or 202, but a controller command for 1Plane programming begins with the hexadecimal code 80$h$ and ends with the hexadecimal code 10$h$. Although the memory 140 executes two controller sub-commands simultaneously in a 2Plane programming operation, the busy time for 2Plane programming is just slightly longer than the busy time for 1Plane programming.

Figure 3:
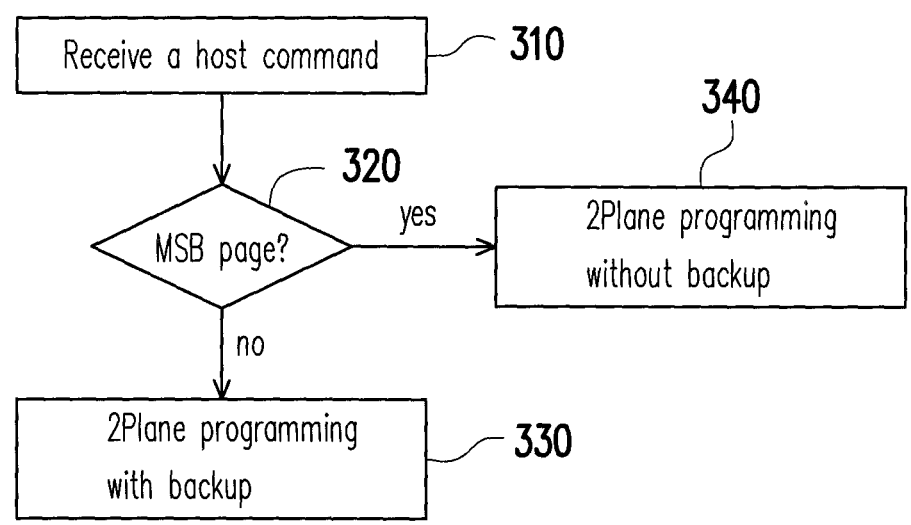
FIG. 3 is a flow chart showing a method for programming a memory according to an embodiment of the present invention.

FIG. 3 is a flow chart showing a method for programming a memory according to an embodiment of the present invention. This method may be executed by the electronic device 100. In step 310, the processor 110 sends a host command for programming a batch of data into a page of the memory 140 to the storage device 120, and the controller 130 receives the host command. In step 320, the controller 130 checks whether or not the page specified by the host command consists of the MSBs of the cells of the memory 140.

When the page specified by the host command does not consist of the MSBs of the cells of the memory 140, in step 330 the controller 130 performs a 2Plane programming to program the data provided by the host command into the page specified by the host command and simultaneously backups the same data into another page of the memory 140. Take the 2Plane programming shown in FIG. 2 for example, the page 231 may be the page of the first plane specified by the host command and the page 232 may be the page of the second plane for data backup. The first plane and the second plane are different planes of the memory 140. The data D1 and the data D2 are the same batch of data provided by the host command.

When the page specified by the host command consists of the MSBs of the cells of the memory 140, the flow proceeds to step 340. The host command may specify multiple pages and provide multiple batches of data to be stored by the pages. The pages specified by the host command may consist of the MSBs of the cells of the memory 140. Therefore, in step 340, the controller 130 may perform another 2Plane programming to program a batch of data into a page specified by the host command and simultaneously program another batch of data into another page specified by the host command without backup for the two batches of data in the memory 140. Take the 2Plane programming shown in FIG. 2 for example, the page 231 may be the first page specified by the host command and the page 232 may be the second page specified by the host command. The data D1 and the data D2 are different batches of data provided by the host command. The pages 231 and 232 are treated as a super page with double capacity in such 2Plane programming.

When the memory 140 is an MLC flash memory, step 330 is executed for the pages in group A and step 340 is executed for the pages in group B. When the memory 140 is a TLC flash memory, step 330 may be executed for the pages in groups A and B and step 340 may be executed for the pages in group C. When the memory 140 is a TLC flash memory, step 340 may also be executed for the pages in group B in order to backup the pages in group A.

The page association rule shown in table 1 is only an example. There are other page association rules existing in current NAND flash memories. In general, a conventional controller of a NAND flash memory needs to backup at least one page consisting of the less significant bits of the memory before programming a page consisting of the MSBs of the memory to meet the page association rule. Since the conventional controller uses 1Plane programming, the total busy time induced by the conventional controller may be expressed as $(T_1+T_2)*N+T_2$, wherein $T_1$ is the time required for reading a page, $T_2$ is the time required for programming a page, and N is the number of the pages consisting of the less significant bits to meet the page association rule. A value of N from 2 to 6 is typical.

In contrast, the controller 130 can simultaneously program and backup a page of less significant bits by 2Plane programming. In other words, the time required for data backup of the pages of less significant bits is hidden in the busy time of 2Plane programming. The controller 130 does not need to take additional time to backup other pages to program an MSB page. Therefore, the total busy time induced by the controller 130 for programming an MSB page is simply $T_2$, which is far shorter than that induced by the conventional controller.

Take the 2Plane programming shown in FIG. 2 for example, the controller 130 may use the data in the page 232 to replace the data in the page 231 when the page 231 is corrupted due to accidents such as sudden power failure.

In an embodiment of the present invention, the processor 110 may maintain some flags to keep track of the status of some important data stored in the memory 140. The controller 130 may send a signal to the processor 110 to indicate that the data D1 is programmed into the page 231 already when the controller 130 finishes the 2Plane programming shown in FIG. 2. The processor 110 may set a flag in response to the signal sent by the controller 130. When an accident happens during the programming of the MSB page associated with the page 231, both of the MSB page and the page 231 may be corrupted. In this situation, the page 231 may cause critical system error, such as booting deadlock, because the flag indicates that the data D1 is already stored in the page 231 but the processor 110 reads corrupted data instead of the correct data D1 from the page 231. The processor 110 may use the backup data in the page 232 to replace the data in the page 231 when the data in the page 231 is requested and the corresponding flag is set and the page 231 is corrupted to prevent or solve the system error.

In summary, the present invention provides a mechanism for better reliability and performance of data-processing electronic devices at the same time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A storage device, comprising:
a memory comprising a plurality of cells, wherein each of the cells stores a plurality of bits, and the bits of the memory are arranged into a plurality of pages of the memory; and
a controller coupled to the memory and receiving a host command for programming a first data into a first page of the memory, wherein when the first page does not consist of the most significant bits of the cells, the controller performs a first 2Plane programming to program the first data into the first page and backups the first data into a second page of the memory, wherein the first page and the second page are located in different planes of the memory,
wherein when the host command is further for programming a second data into the second page and when both of the first page and the second page consist of the most significant bits of the cells, the controller performs a second 2Plane programming to program the first data into the first page and program the second data into the second page without backup for the first data and the second data in the memory.

2. The storage device of claim 1, wherein the memory comprises a buffer, the first 2Plane programming comprises a first controller sub-command for programming the first data into the first page and a second controller sub-command for programming the first data into the second page, the memory stores the first controller sub-command into the buffer without executing the first controller sub-command when the memory receives the first controller sub-command from the controller, the memory executes both of the first controller sub-command and the second controller sub-command when the memory receives the second controller sub-command from the controller.

3. The storage device of claim 1, wherein the pages are arranged into a plurality of blocks of the memory, the first page and the second page belong to different ones of the blocks in different planes, the first page and the second page have same index number in the different ones of the blocks.

4. The storage device of claim 1, wherein the controller uses the first data in the second page in response to corruption of the first data in the first page when the first data in the first page is requested.

5. An electronic device, comprising:
the storage device of claim 1; and
a processor coupled to the storage device and providing the host command to the storage device.

6. The electronic device of claim 5, wherein the controller sends a signal to the processor to indicate that the first data is programmed into the memory already when the controller finishes the first 2Plane programming, the processor sets a flag in response to the signal, the processor uses the first data in the second page in response to the setting of the flag and corruption of the first data in the first page when the first data in the first page is requested.

7. A method for programming a memory, the memory comprising a plurality of cells, each of the cells storing a plurality of bits, the bits of the memory arranged into a plurality of pages of the memory, the method comprising:
receiving a host command for programming a first data into a first page of the memory; and
when the first page does not consist of the most significant bits of the cells, performing a first 2Plane programming to program the first data into the first page and backups the first data into a second page of the memory, wherein the first page and the second page are located in different planes of the memory, wherein when the host command is further for programming a second data into the second page and when both of the first page and the second page consist of the most significant bits of the cells, the method further comprises:

performing a second 2Plane programming to program the first data into the first page and program the second data into the second page without backup for the first data and the second data in the memory.

8. The method of claim 7, wherein the memory comprises a buffer, the first 2Plane programming comprises a first controller sub-command for programming the first data into the first page and a second controller sub-command for programming the first data into the second page, and the method further comprises:

storing the first controller sub-command into the buffer without executing the first controller sub-command when the memory receives the first controller sub-command; and executing both of the first controller sub-command and the second controller sub-command when the memory receives the second controller sub-command.

9. The method of claim 7, wherein the pages are arranged into a plurality of blocks of the memory, the first page and the second page belong to different ones of the blocks in different planes, the first page and the second page have same index number in the different ones of the blocks.

10. The method of claim 7, further comprising:

using the first data in the second page in response to corruption of the first data in the first page when the first data in the first page is requested.

11. The method of claim 7, further comprising:

sending a signal to indicate that the first data is programmed into the memory already when the first 2Plane programming is finished;

setting a flag in response to the signal; and using the first data in the second page in response to corruption of the first data in the first page when the flag is set and the first data in the first page is requested.

* * * * *

UNITED STATES PATENT AND TRADEMARK OFFICE
CERTIFICATE OF CORRECTION

| | | |
|---|---|---|
| PATENT NO. | : 9,245,633 B2 | Page 1 of 1 |
| APPLICATION NO. | : 14/340558 | |
| DATED | : January 26, 2016 | |
| INVENTOR(S) | : Yi-Hsin Liao et al. | |

It is certified that error appears in the above-identified patent and that said Letters Patent is hereby corrected as shown below:

On the Title page, insert -- 60 Provisional application No. 61/929,986, filed on January 22, 2014 --.

Signed and Sealed this
Twenty-sixth Day of April, 2016

Michelle K. Lee
*Director of the United States Patent and Trademark Office*